US006667674B2

(12) United States Patent
de Swiet et al.

(10) Patent No.: US 6,667,674 B2
(45) Date of Patent: Dec. 23, 2003

(54) NMR RESONATORS OPTIMIZED FOR HIGH Q FACTOR

(75) Inventors: Thomas de Swiet, Redwood City, CA (US); Wai Ha Wong, San Jose, CA (US); Marco Romo, Castro Valley, CA (US); James Finnigan, Santa Clara, CA (US); Sean Burns, Mountain View, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/122,055

(22) Filed: Apr. 12, 2002

(65) Prior Publication Data

US 2003/0193380 A1 Oct. 16, 2003

(51) Int. Cl.[7] ................................................. H01P 7/00
(52) U.S. Cl. ........................................ 333/219; 324/318
(58) Field of Search ............................... 333/219, 222, 333/223, 227; 324/318, 322

(56) References Cited

U.S. PATENT DOCUMENTS

| 4,641,098 | A |   | 2/1987  | Doty ........................... 324/322 |
| 4,694,255 | A |   | 9/1987  | Hayes .......................... 324/318 |
| 6,087,832 | A |   | 7/2000  | Doty ........................... 324/318 |
| 6,118,274 | A | * | 9/2000  | Roffmann et al. ........... 324/321 |
| 6,285,189 | B1|   | 9/2001  | Wong .......................... 324/318 |
| 6,377,047 | B1| * | 4/2002  | Wong et al. ................. 324/318 |
| 6,498,487 | B1| * | 12/2002 | Haner ......................... 324/318 |

FOREIGN PATENT DOCUMENTS

| JP | 62 154606 A    | 7/1987  |
| JP | 01 078137 A    | 3/1989  |
| WO | WO 01/94964 A  | 12/2001 |

OTHER PUBLICATIONS

Article by Thomas Vullo et al., entitled "Experimental Design and Fabrication of Birdcage Resonators for Magnetic Resonance Imaging", published in Magnetic Resonance in Medicine, 24, 243–252 (1992).

Crozier, S. et al., entitled "Optimized Small–Bore, High–Pass Resonator Designs" published by Journal of Magnetic Resonance, Series B, Academic Press, Orlando, FL, US, vol. 109, No. 1 Oct. 1, 1995, pp. 1–11.

* cited by examiner

Primary Examiner—Terry D. Cunningham
Assistant Examiner—Quan Tra
(74) Attorney, Agent, or Firm—Edward H. Berkowitz

(57) ABSTRACT

A birdcage resonator has a pair of conductor rings separated from each other along a central axis and a plural number of axially disposed conductor rungs, which extend between the rings and are evenly spaced around the central axis. Each of the rungs has a sectional shape with thickness or a radial extension comparable to or greater than its width or its azimuthal extension. Measures of the width and thickness of the rungs may be determined by using them as parameters to calculate the values of Q factor from an analytical procedure to locate parameter value ranges corresponding to maximal Q. Geometric calculations for filling factor yield ranges of parameters providing for compromise parameter values. Saddle coils have been found to exhibit similar enhancement of Q with radially oriented conductor cross section.

10 Claims, 5 Drawing Sheets

SECTION A-A

DETAIL B

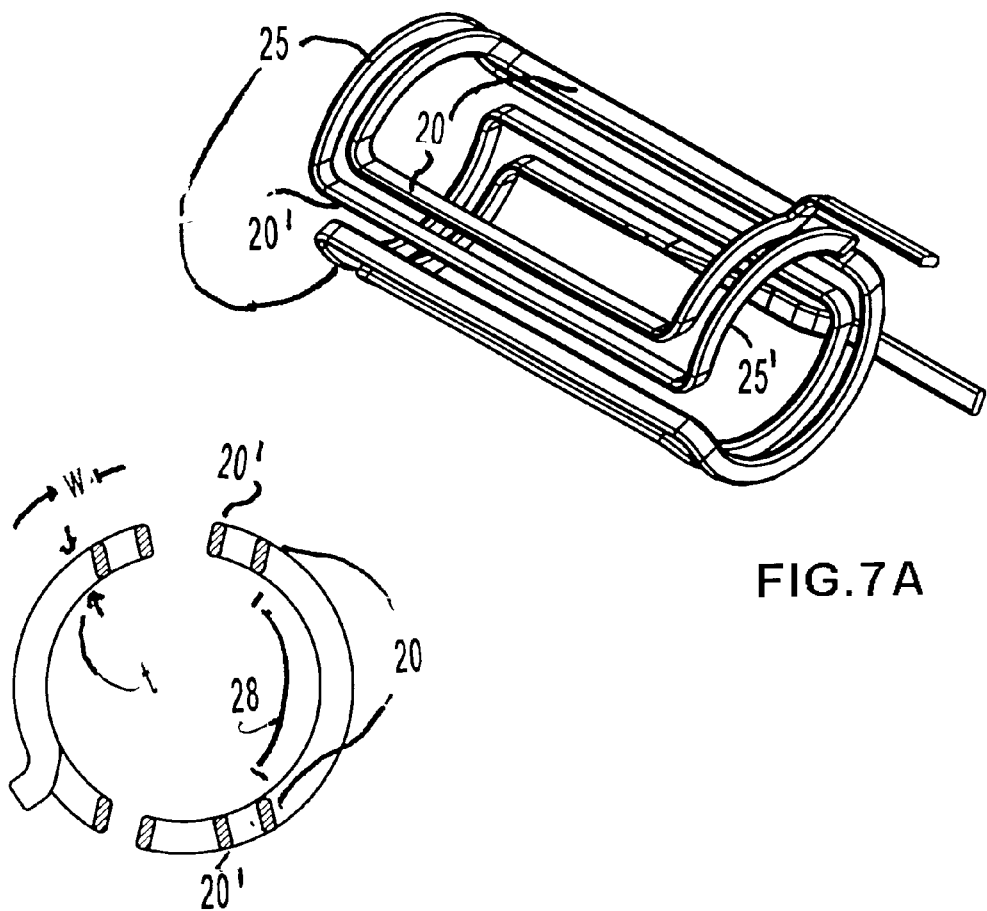
FIG.7A
FIG.7C
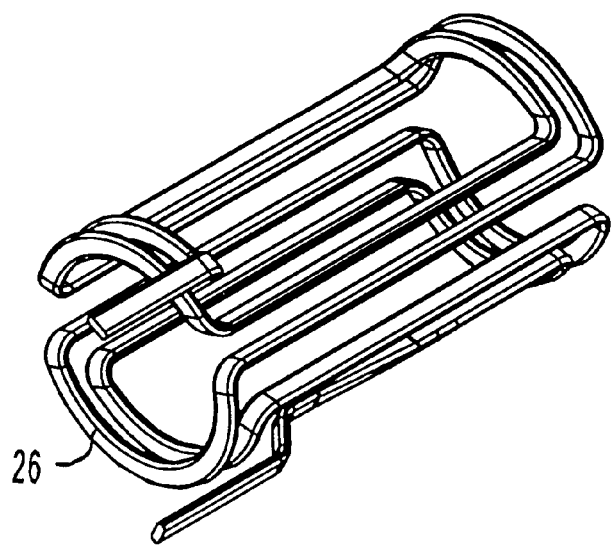
FIG.7B

NMR RESONATORS OPTIMIZED FOR HIGH Q FACTOR

BACKGROUND OF THE INVENTION

This invention relates to NMR resonators. More particularly, this invention relates to a method of optimizing birdcage and related resonators for high Q factor, as well as birdcage resonators thus optimized.

It has been known to structure a radio-frequency resonator coil in a birdcage form in order to obtain a highly homogeneous magnetic field as described, for example, in U.S. Pat. No. 4,694,255 issued Sep. 15, 1987 to C. Hayes and "Experimental Design and Fabrication of Birdcage Resonators for Magnetic Resonance Imaging" (T. Vullo, et al., Magnetic Resonance in Medicine, 24, 243 (1992)). Birdcage resonators are so called because of their general structure having a pair of generally circular conductive elements (the "rings") separated in a longitudinal direction to define the axis of the resonator and a plurality of conductive segments (the "rungs") evenly spaced about the circumference of and interconnecting these two ring elements. The nomenclature, "rungs", derives from the topology of birdcage coils: when mapped to a plane, the birdcage coil is recognized as a ladder type of LC network.

Birdcage resonators of different types have been produced, depending on the desired features. Capacitors are inserted either in the rungs for a low-pass coil, or in the rings for a high-pass coil. In the present work, "coil" and "resonator" will generally be used interchangeably, reflecting a typically integral LC structure of the object.

The N rungs (N>1) of the birdcage coil, being equally spaced about the azimuthal direction of the coil, support RF phases separated by equal increments. In an extreme example, the number of rungs has been increased substantially to form a so-called millipede coil in order to increase field homogeneity. U.S. Pat. No. 6,285,189 B1.

Many previous birdcage coils have been constructed from rungs made of copper sheet or foil with its plane perpendicular to the radial direction. This was not only due to the ease of construction but also in order to maximize the space available for a sample in view of the inner radius of the radio frequency shield. In the present invention it has been found that the cross sectional dimensions of the rungs of the birdcage coil effect the resulting Q of the coil. The filling factor of the coil (a volumetric measure of the spatial capacity for a sample) is directly effected and a lower value for filling factor diminishes the realizable signal-to-noise ratio for the NMR apparatus.

In passing, it is noted that previous NMR resonators of solenoidal geometry have employed conductors having cross sectional dimensions a, b, such that a and b are similar. Certain such solenoidal resonators, purposely so constructed, have been found to exhibit significantly enhanced Q. U.S. Pat. No. 6,087,832.

Most previous works on birdcage coil design paid relatively little attention to the unloaded coil Q. This is reasonable if the coil is to be used for the imaging of relatively large (tens of cm) lossy biological samples since $1/Q_{total} = 1/Q_{sample} + 1/Q_{coil}$ where $Q_{total}$, $Q_{sample}$ and $Q_{coil}$ are respectively the total Q factor, the Q factor of the sample and the Q factor of the coil and $Q_{sample} << Q_{coil}$ in most such applications. If the coil and sample size decreases, however, the coil Q factor starts to strongly affect the performance because $Q_{sample}$ and $Q_{coil}$ vary proportionally to $L^{-4}$ and L, respectively, where L is the length scale of the coil and sample.

SUMMARY OF THE INVENTION

It is therefore an advantage of this invention to provide a birdcage resonator coil designed to maximize its Q factor by optimizing the gap and rung dimensions.

This invention provides a method of producing a birdcage resonator coil by properly designing the cross-sectional shape of its rungs.

It is yet another advantage of the invention to extend the foregoing to related resonant coil structures.

A birdcage resonator coil embodying this invention, with which the above and other objects can be achieved, may be characterized as comprising a pair of conductor rings separated from each other along a central axis and a plural number of linearly elongated conductor rungs which extend between the rings and are spaced azimuthally around the central axis, wherein each of the rungs is cross-sectionally so dimensioned that its radial extension (thickness) is at least greater than its azimuthal extension (width). Among other dependencies of Q, a lower resistance for the rungs (inductive elements) leads to a higher Q. Although a larger cross section for these inductive elements will reduce the resistance, the filling factor may be compromised by the intrusion of the radial component of the enlarged cross section. The radial extension outwardly promotes further RF losses on a surrounding shield. As the azimuthal component of the inductor cross section increases, the spatial interval between rungs decreases and the constraints on the B field of the coil lead to local distortion of that field. A more important consideration is that the localized regions of high field imply localized regions of intense surface current density for proximate conductors and consequent high Ohmic losses. Thus, Q is degraded for birdcage coils as the spatial interval between rungs is reduced. It can be ascertained that the Q factor can be thereby improved without significantly affecting its filling factor by solving Maxwell's equations numerically in two dimensions for the magnetic vector potential, from which the magnetic field distribution can be derived for a transverse section of the interior volume of the coil. The geometric properties of the conductor dimensions effecting Q may be reconciled with field distribution to obtain a satisfactory compromise for coil design. Alternatively, an NMR resonator may be in the form of a so-called saddle coil comprising a wire flattened to present a sufficient width and thickness consistent with the principles described herein for optimization of birdcage resonators.

BRIEF DESCRIPTION OF THE DRAWINGS

FIGS. 7A and 7B are perspective views of a saddle coil embodying this invention, and 7C is a section through this structure.

DETAILED DESCRIPTION OF THE INVENTION

Figure 2:
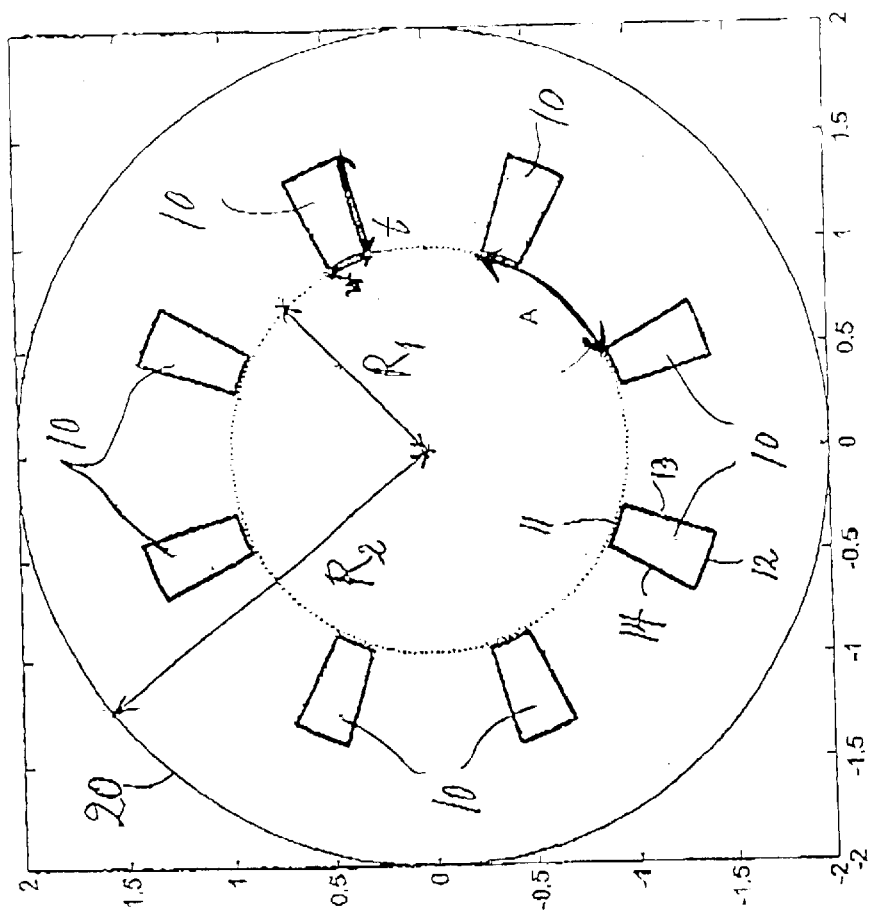
FIG. 2 is a sectional view of the birdcage coil of FIG. 1 and a radio frequency shield surrounding it, as seen along its axial direction.
Figure 1:
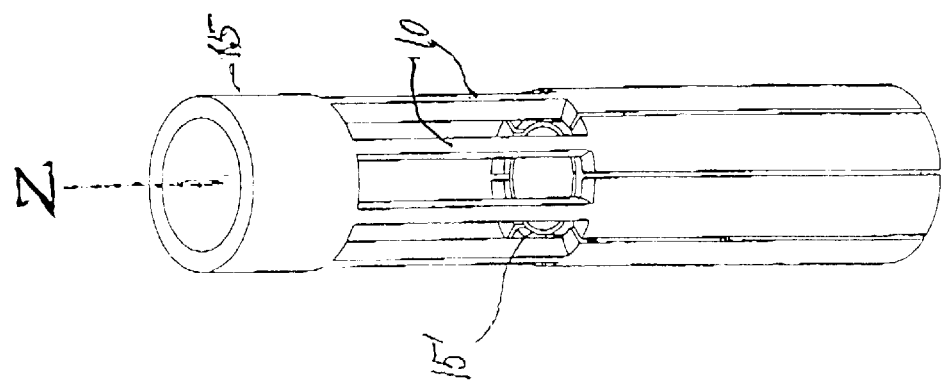
FIG. 1 is perspective view of a birdcage resonator coil embodying this invention.

The invention is described next by way of a typical example of birdcage resonator coil geometry of a type having a plurality (N=8) of rungs. FIG. 1 is its external view, showing eight rungs 10 extending axially (in the z-direction) between two conductive rings 15 and 15' separated from each other along the z-direction. The width, thickness and general cross-sectional shape of the rungs 10 in this figure are meant to illustrate a feature of the invention. FIG. 2 is a sectional view of the resonator of FIG. 1 taken along the z-direction, showing the rungs 10 disposed circularly about the rings 15 at equal azimuthal intervals. In practice, the coil of FIG. 1 is disposed inside a radio frequency shield 20 (not shown in FIG. 1) with inner radius indicated by symbol $R_2$. Each rung 10 has an internally facing surface 11, an externally facing surface 12 and two side surfaces 13 and 14 such that its cross-sectional shape as shown in FIG. 1 is a geometrical figure surrounded by two side edges of length t representing the (radial) thickness of the rung 10, a shorter circular arc of width w with a radius of curvature R1 representing the aforementioned internally facing surface 11 and a longer circular arc representing the externally facing surface 12.

It will be assumed that the wavelength is long compared to the geometrical size of the coil, that the length of the coil is large compared to $R_1$, and that the radio frequency skin depth $\delta$ in the metal of the rung material is small compared to the cross-sectional dimensions of the rung. Under these assumptions, solution of Maxwell's equations may reduce to solving the Laplace equation in 2 dimensions for the z-component of the magnetic vector potential $A_z$. The boundary conditions for the solution, appropriate;for the coil cross-section shown in FIG. 1, are that $A_z=0$ at the shield radius and that $A_z=A_0 \cos(2\pi n/N)$ on the surface of the nth rung where n=1, 2, ..., N and $A_0$ is an arbitrary constant. Once $A_z$ is found, the transverse magnetic field $B(r, \theta)$ can be calculated from $B=\nabla \times A_z$.

It is further assumed that the resistive loss of the rungs 10 dominate the coil Q factor ($Q_{coil}$). It can then be shown that resistive dependencies for $Q_{coil}$ may be determined geometrically as follows:

$$Q_{coil}=(R_1/\delta)f(w/A,\ t/(R_2-R_1),\ N,\ R_2/R_1) \qquad (1)$$

where $A=2\pi R_1/N$ is the arc length indicated in FIG. 1 and the function f is a dimensionless function which can be calculated from the numerical solution of the Laplace equation:

$$f=2\int A_z \nabla A_z \cdot n_0 dl / \int (\nabla A_z \cdot n_0)^2 dl. \qquad (2)$$

Symbols $\int dl$ each indicate a line integral over the metal boundaries as shown in FIG. 1 with no indicating the local unit vector normal to the boundary (or the line element d1). It is assumed that the aforementioned Laplace equation has been solved for $A_z$, in particular in units of lengths where $R_1=1$.

Figure 3:
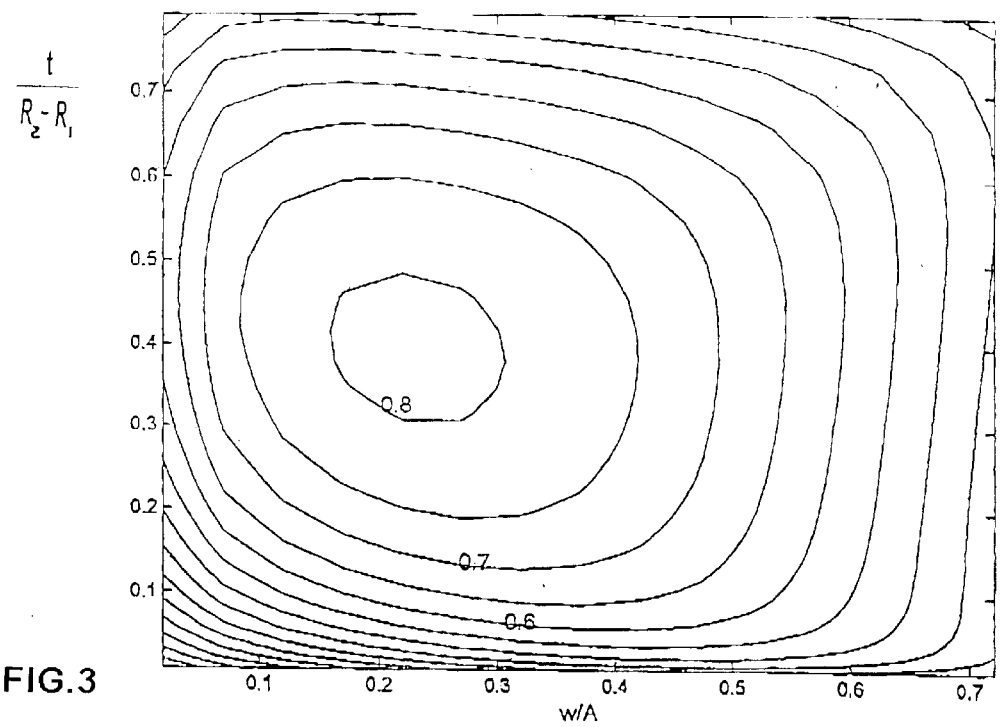
FIG. 3 is a two-dimensional contour diagram showing the value of a function related to the Q factor of the coil of FIGS. 1 and 2 as a function of two selected parameters.

FIG. 3 is a two-dimensional contour diagram for showing the values of $f(w/A, t/(R_2-R_1), 8, 3)$, that is, the values of the function f with w/A and $t/(R_2-R_1)$ serving as two parameters when N=8 and $R_2/R_1=3$. The value of the Q factor given by (1) is an overestimate because of conductive loss in the ends of the coil and radiative loss and dielectric loss have all been neglected. The optimal rung configuration for a relatively long birdcage coil with respect to its radius is a favorable starting point for a real design in the absence of any better information, and FIG. 3 suggests that such a starting point would be w/A about equal to 0.2 and $t/(R_2-R_1)$ about equal to 0.4 if N=8 and $R_2/R_1=3$, corresponding to a broad maximum in the contour function.

As a practical matter, the coil designer would regard the ratio $R_2/R_1$ as fixed by external criteria, and the number of rungs N is usually limited to a certain range by practical construction considerations. Actual test calculations of the function f by the present inventors indicate that the Q factor is improved at smaller values of N as long as $R_2/R_1$ is sufficiently large, but the radio frequency homogeneity characteristic of the coil is adversely affected if N is too small. This is why examples with N=8 are exclusively presented herein, although this is not intended to limit the scope of the invention.

Figure 4:
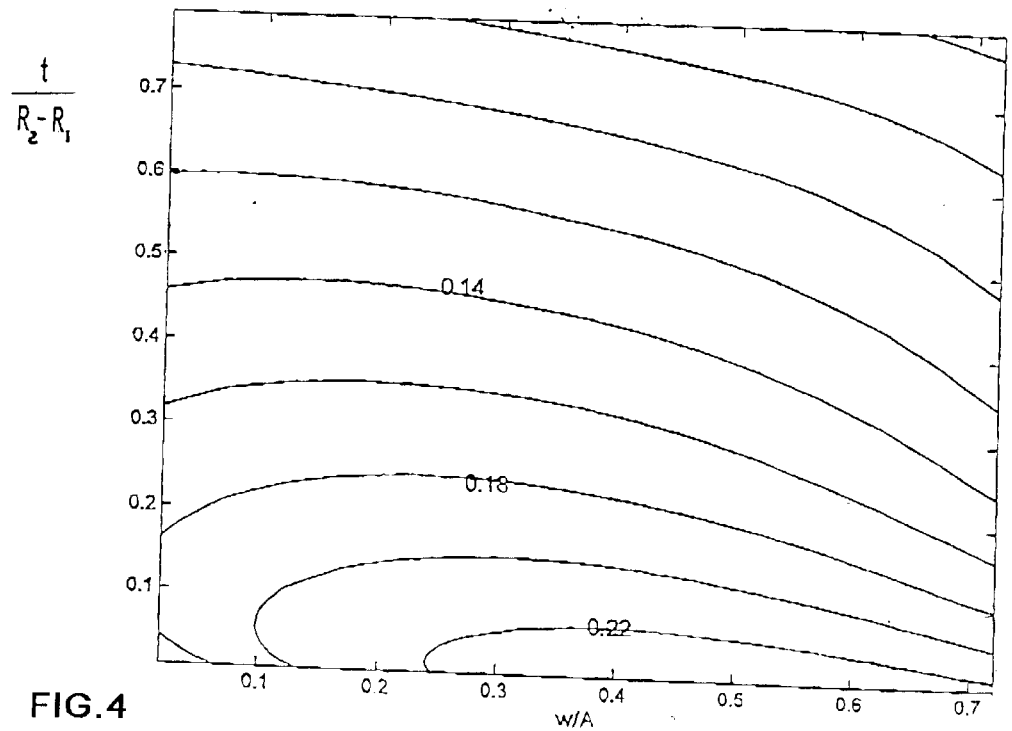
FIG. 4 is a two-dimensional contour diagram showing the filling factor of the coil of FIGS. 1 and 2 as a function of the same two parameters as for the diagram of FIG. 3.
Figure 5B:
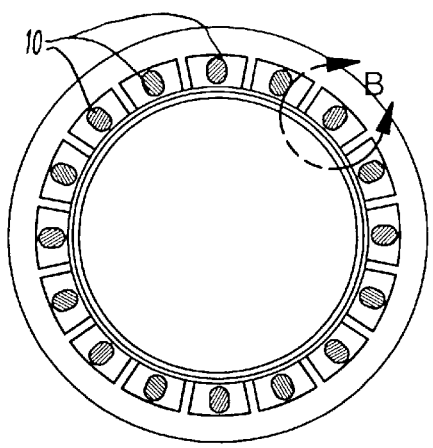
FIG. 5 shows another birdcage resonator coil embodying this invention serving as a low pass filter, FIG. 5A being a perspective view, FIG. 5B being it's a sectional view taken along line 5B–5B in FIG. 5C, and FIG. 5C being its side view.
FIG. 5D is a detail illustrating the conductor cross section.
Figure 5D:
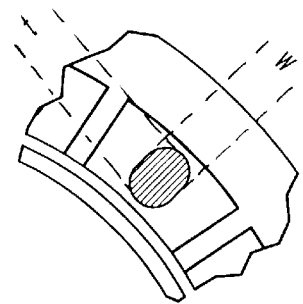
Figure 5C:
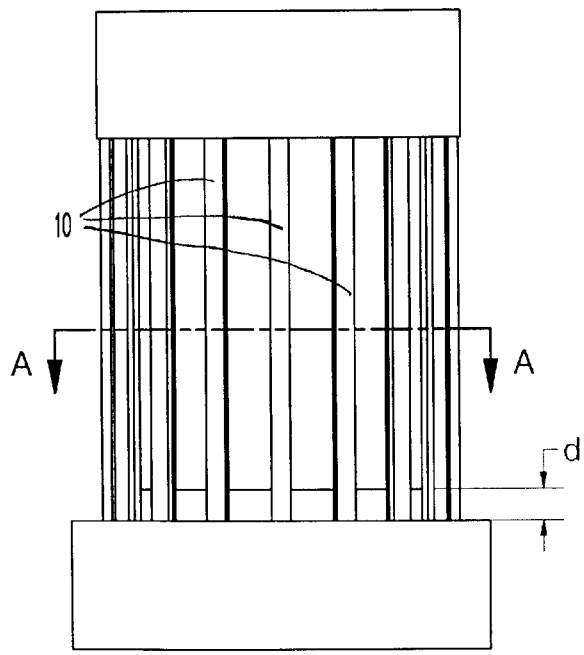
Figure 5A:
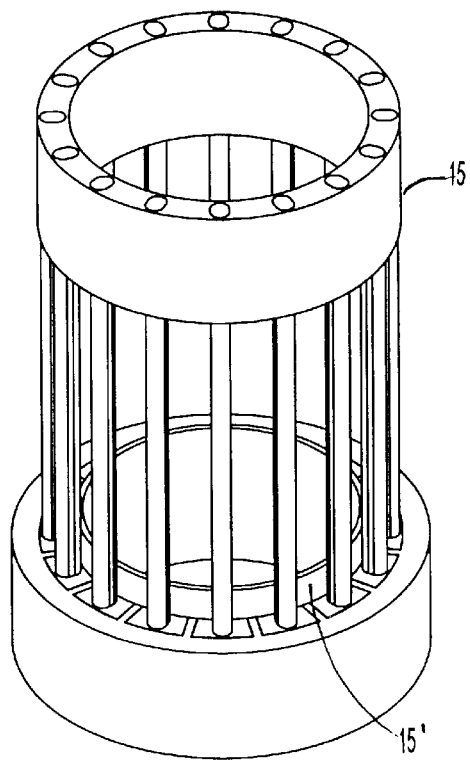

An important issue is that the filling factor of the coil should preferably be maximized simultaneously with the coil Q factor. The filling factor of a coil is a dimensionless parameter defined as follows:

$$\eta=\int_{sample} B^2 dV/\int_{all\ space} B^2/dV \qquad (3)$$

where the integral in the numerator is a volume integral over the sample volume, that is, the space inside the birdcage coil and that in the denominator is a volume integral over all space. The filling factor $\eta$ can be calculated according to (3) by using the numerical solution of Maxwell's equations outlined above for the different rung cross-sectional shapes. FIG. 4 shows the values of filling factor thus calculated for cases where N=8 and $R_2/R_1=3$.

Comparison of FIGS. 3 and 4 shows that a compromise is necessary in selecting the optimum set of parameters N and $t/(R_1-R_2)$ because $\eta$ and Q cannot be maximized independently with the same geometrical parameters. One approach to the necessary compromise is to maximize the product $\eta \cdot Q$. Another approach is to maximize Q while maintaining $\eta$ above a selected critical value.

An embodiment for simultaneously improving both the high Q factor and the high filling factor has been constructed to test these principles. The present inventors designed a coil made of copper with N=8, w/A=0.25 and $t/(R_2-R_1)=0.15$ for use when $R_2/R_1=3$ (such that w/t is about 0.65, significantly smaller than 1) as a prototype of this invention. For comparison with a conventional prototype with 8 copper foil rungs, $R_1$ was equal to 3.4 mm and the window length was taken to be 14 mm, capacitance being distributed at the bottom of the window through a quartz tube to an inner copper foil cylinder and the coil being shorted at the top of the window. (The "window" is standard nomenclature for the space between rungs). The unloaded Q, measured in conventional manner for a birdcage resonator of the above dimensions, was found to be 562 at 550 MHz with the RF shield in place. For comparison, a reference birdcage resonator of similar overall dimension and N=12 foil rungs, w/A=1/3, $t/(R_2-R_1)=0.008$ and $R_2/R_1=3$ was constructed and both resonators measured. The ratio $Q_{invention}/Q_{reference}=1.6$ was determined. By calculation, a ratio of 1.8 was expected. An actual enhancement in Q value of at least 60% in has thus been demonstrated using the present invention.

The invention has been described with reference to an example, but this example is not intended to limit the scope of the invention, but merely to describe the basic ideas supporting the invention. Many modifications and variations are possible within the scope of the invention. For example, still considering the birdcage geometry, the number of the rungs N need not be 8 as long as the corresponding contour plot of the Q factor, such as shown in FIG. 3, shows a maximum corresponding to reasonable values of parameters w/A and $t/(R_2-R_1)$. Although rungs with cross-sectional shape of a figure bounded by a pair of mutually concentric circular arcs and straight radial lines were considered, this was rather for the convenience of solving the Laplace's equation (2) given above. Generally, sharp edges of any current carrying conductor are to be eliminated. Rungs with oval, elliptical or rounded rectangular cross-section are preferred, as shown in FIGS. 5 and 6. Even with the rungs with the cross-sectional shape as shown in FIG. 2, the sharp edges are usually polished (for example, by means of a chemical polish or #4 finish) and rounded off after they are machined, although the rounding of the corners is not shown in the figure.

As already explained above, the method of this invention includes an element of compromise between the Q factor and the filling factor, and hence the method is not intended to uniquely determine an optimum set of parameters to characterize the sectional shape of the rungs. One surprising result of the invention, however, is that the thickness t is best selected to be larger than the width w, while their relationship was exactly opposite in birdcage resonators of the prior art. In other words, the rungs of birdcage resonator coils of this invention may be characterized as having a radial extension (or thickness) that is greater than its azimuthal extension (or width). Such choice promotes the Q at some expense in filling factor (due to the radial intrusion of the inductive element into the interior volume of the coil), but this aspect is of design choice is more easily managed. The shape of such rungs is not limited to those shown in FIG. 2, but could be rectangular or elliptical as well. This work demonstrates that an improvement in Q of by a factor greater than approximately 50% is achievable by the present invention over the best prior art result while the filling factor of the coil is reduced by about 20%.

Figure 6B:
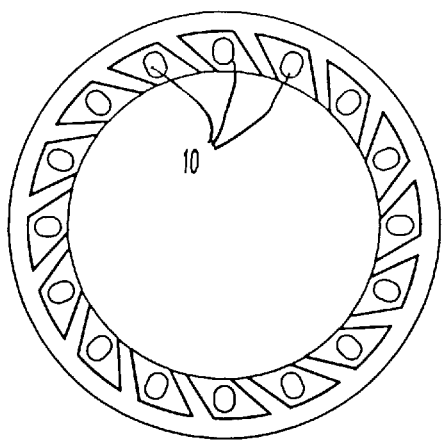
FIG. 6 shows still another birdcage resonator coil embodying this invention serving as a high pass filter, FIG. 6A being a perspective view, FIG. 6B being a sectional view taken along line 6B–6B in FIG. 6C, and FIG. 6C being its side view.
Figure 6A:
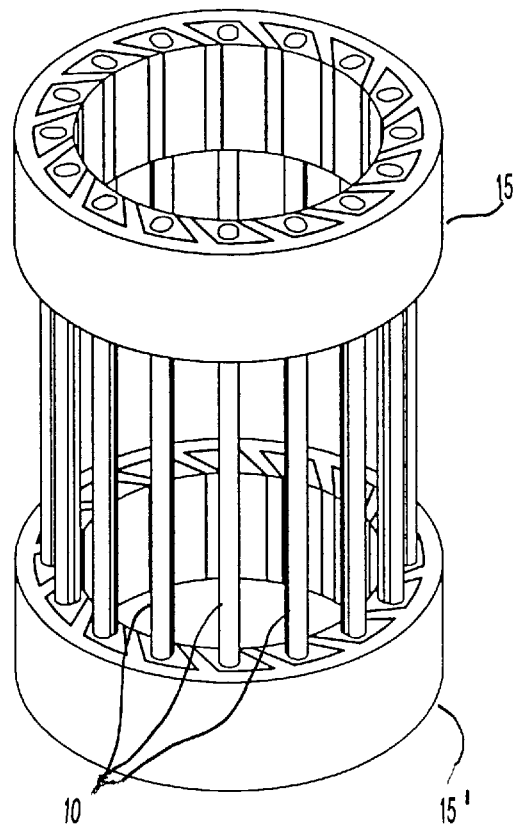
Figure 6C:
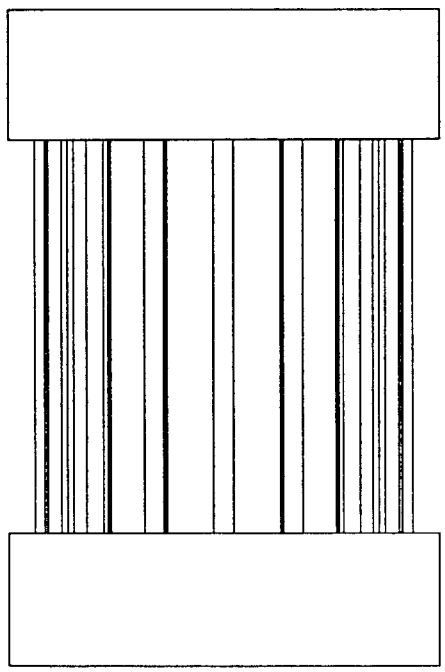

FIG. 5 (comprising FIGS. 5A, 5B and 5C) and 6 (comprising FIGS. 6A, 6B and 6C) show further examples of birdcage coils embodying this invention serving respectively as a low pass filter (FIG. 5) and a high pass filter (FIG. 6), characterized as having rungs with a cross-sectional shape of a circle. FIG. 5D shows the cross section of the rungs indicating both the radial and azimuthal extensions (t and w). These examples are further characterized in that at least one of the conductor rings at either end of the rungs is provided with a dielectric ring and the dielectric material (such as polytetrafluoroethylene) fills the gaps between each mutually adjacent capacitance-providing pairs of metal pieces (capacitor bank) both for increasing the capacitance values therebetween and for improving the mechanical strength of the structure. The shape of these gaps is not intended to limit the scope of the invention. Since it is generally preferable to have components without sharp edges and also from the point of view of the ease of manufacture, the design shown in FIG. 6 may be considered preferable. FIG. 5C shows that the lower ring 15' is at a higher position (by a positive distance d) than the bottom end of the rungs 10 (or the top edge of the capacitor bank). The lower ring 15' and the top ring 15 define therebetween the RF window and the lower ring 15' shielding the electric field between the inner ring 15' and the lower capacitor bank.

The present invention has been found to be applicable to so-called saddle coils such as described in U.S. Pat. No. 4,641,098. One example may be characterized as being formed of a single conductive wire which is bent according to a pattern to form a serial 2 turn saddle coil and therefore including a plurality (four according to the example shown) of mutually parallel pairs of wire portions extending parallel to the axial direction of the coil. The wire portions of each pair are placed proximally to and separated from each other non-uniformly in the azimuthal direction and carry a current in the same direction. According to prior art technology, as disclosed in aforementioned U.S. Pat. No. 4,641,098, a wire of an ordinary kind, or a wire of a circular cross-sectional shape was used to form the saddle coil. Such wires have cross sectional dimensions which are quite small compared with dimensions of the coil and do not promote the Q through consideration of wire cross section. It is also common to construct saddle coils from foil conductors, which can limit the Q for the reasons described above. A saddle coil such as shown in FIG. 4 is known in the art as a Helmholtz pair, current carrying loops forming a first group being disposed in series with, and oppositely facing a second group. In the NMR application, these loops are (usually) constrained to a curved surface (the azimuthal dimension of a sensitive volume with two portions of each loop being parallel/antiparallel with the cylindrical axis of the sensitive volume. Helmoltz pairs may also be electrically related in parallel. These types of saddle coils and the birdcage coil each represent quite distinct topologies.

FIG. 7 (comprising FIGS. 7A, 7B and 7C) shows a two-turn series saddle coil embodying this invention. It is formed with a wire bent according to the identical pattern but is different in that the wire is not of an ordinary type having a nearly circular cross-sectional shape but is flat such that its angular width w is much smaller than: its radial thickness. FIG. 7c is shown to better exhibit a section taken through the saddle coil of FIGS. 7a–7b. The saddle coil comprises turns formed of a conductor having axial portions 20 joined by a portion 25. The turn adjoins another turn (in the two-turn saddle coil shown) or serially connects to a turn disposed oppositely in respect of the coil axis. The axial conductors 20 are usually spaced to produce at least a pair of wide windows 28, i.e., an open angular spacing between adjacent conductors 20 comprising the same turn. Consequently, these conductors are widely spaced while adjacent conductors from different turns (20 and 20') are relatively closely spaced. This typical spacing is clearly non-uniform in the azimuthal direction. Relative cross-sectional dimensions t and w were selected in general accordance with the above described rational and a serial saddle coil was constructed exhibiting a generally flattened elliptical conductor cross section measuring 0.02"×0.07". A second saddle coil of identical geometry and overall dimensions was constructed using 0.025" circular cross section wire. The measured Q for the flattened elliptical cross section yielded a value of 420 compared to the value of 380 for the conventional cross-sectioned example, a 9.5% enhancement. These typical results are in accord with optimization of Q for birdcage coils. One is reminded in considering these results that the topology of the serial saddle coil is quite distinct from the periodic ladder topology of the birdcage resonator, but that the general resistive dependencies for Q are similar. This work demonstrates a significant avenue for enhancement of the Q for NMR resonators. The inward radial extension of the cross-section of an inductive member of a NMR resonator provides a manner of enhancing the Q, at the expense of the filling factor. As a practical matter the latter quantity limits the size of samples and/or the realizable signal-to-noise ratio, but these are independently subject to the judgment of the user. Although an outward radial extension of the inductor cross section may provide the same enhancement of Q at the expense of RF losses in respect of a surrounding RF shield, the latter usually represents a fixed dimensional constraint.

The approach by this invention is expected to be useful mainly in imaging small samples, or spectroscopy where the coil Q factor is important, the NMR sensitivity being proportional to the square root of Q.

Although this invention has been described with reference to particular embodiments and examples, other modifications and variations will occur to those skilled in the art in view of the above teachings. The invention may be usefully employed to increase the Q of NMR resonators of a wide variety of types. It should be understood that, within the scope of the appended claims, this invention may be practiced otherwise than as specifically described.

What is claimed is:

1. An NMR resonator comprising a saddle coil having a Z axis, said saddle coil formed from a conductor exhibiting a cross sectional shape and said shape having gross dimensions of t by w and t>w, wherein said conductor is oriented so as to present said dimension t radially in respect to said axis.

2. The saddle coil of claim 1, wherein said saddle coil comprises a Helmholtz pair in series.

3. The saddle coil of claim 1, wherein said saddle coil comprises a Helmholtz pair in parallel.

4. A method of producing a birdcage resonator coil, said coil having a pair of conductor rings separated from each other along a central axis and a plural number of linearly elongated electrically resistive conductor rungs which extend between said rings and are evenly spaced around said central axis, each of said rungs having a sectional shape with width w in azimuthal direction around said central axis and thickness t in radial direction, wherein said rungs define therein a cylindrical sample space with radius $R_1$, said resonator coil being placed inside a radio frequency shield with a cylindrical inner surface with radius $R_2$, said method comprising the step of:

determining values of w and t such that t is greater than w, wherein said birdcage resonator coil has a greater Q factor than a comparable birdcage resonator coil with width equal to or greater than thickness, said values of w and t being determined with respect at least in part to $R_1$ and $R_2$ by the steps of:

solving Maxwell equations in radial and aximuthal dimensions for magnetic vector potential $A_z$;

calculating transverse magnetic field $B(r,\theta)$ from said magnetic vector potential;

calculating a resistive component of the Q factor of said coil with w and t as parameters;

calculating filling factor of said coil with w and t as parameters; and selecting values of w and t so as to maximize the corresponding Q factor without reducing the corresponding filling factor beyond a specified limit.

5. The method of claim 4, wherein the step of calculating the Q factor includes the step of calculating $\int A_z \nabla A_z \cdot n_0 \, dl / \int (\nabla A_z \cdot n_0)^2 \, dl$ wherein symbols $\int dl$ each indicate a line integral around one of said rungs and $n_0$ indicates a local unit vector normal to said one rung.

6. The method of claim 4, further comprising the step of machining two solid pieces of copper to form said coil comprising dimensions from said step of selecting.

7. The method of claim 6, further comprising the step of smoothing sharp edges of said coil.

8. The method of claim 4, further comprising the step of polishing said rungs to round off sharp edges.

9. The method of claim 8, wherein said polishing steps is carried out by using a chemical polish.

10. The method of claim 9, wherein said polishing steps is carried out by using #4 finish.

* * * * *